United States Patent [19]

Altman et al.

[11] Patent Number: 5,024,372
[45] Date of Patent: Jun. 18, 1991

[54] METHOD OF MAKING HIGH DENSITY SOLDER BUMPS AND A SUBSTRATE SOCKET FOR HIGH DENSITY SOLDER BUMPS

[75] Inventors: Leonard F. Altman, Coral Springs; Jill L. Flaugher, Margate; Anthony B. Suppelsa, Coral Springs; William B. Mullen, III, Boca Raton, all of Fla.

[73] Assignee: Motorola, Inc., Schaumburg, Ill.

[21] Appl. No.: 520,995

[22] Filed: May 9, 1990

Related U.S. Application Data

[63] Continuation of Ser. No. 292,988, Jan. 3, 1989, abandoned.

[51] Int. Cl.$^5$ ............ H01L 21/60; H05K 3/34; B23K 31/02
[52] U.S. Cl. .................... 228/248; 228/254; 228/215
[58] Field of Search .......... 228/179, 180.2, 248, 228/254, 215; 437/209; 427/376.7, 376.8, 282; 357/67; 430/315

[56] References Cited

U.S. PATENT DOCUMENTS

| | | | |
|---|---|---|---|
| 3,436,818 | 4/1969 | Merrin et al. | 228/254 |
| 3,589,000 | 6/1971 | Galli | 228/254 |
| 3,986,255 | 10/1976 | Mandal | 228/254 |
| 4,032,058 | 6/1977 | Riseman | 228/180.2 |
| 4,273,859 | 6/1981 | Mones et al. | 430/315 |
| 4,311,267 | 1/1982 | Lim | 228/248 |
| 4,739,917 | 4/1988 | Baker | 228/180.2 |
| 4,818,728 | 4/1989 | Rai et al. | 228/179 |

FOREIGN PATENT DOCUMENTS 136990 8/1984 Japan ................... 228/248

OTHER PUBLICATIONS

IBM Technical Disclosure Bulletin, vol. 15, No. 5, p. 1715, Oct. 1972.
IBM Technical Disclosure Bulletin, vol. 17, No. 8, p. 2331, Jan. 1975.
Metals Handbook Ninth Edition, vol. 6, pp. 1100, 1101, copyright 1983.

*Primary Examiner*—Sam Heinrich
*Attorney, Agent, or Firm*—Daniel K. Nichols

[57] ABSTRACT

A method of forming solder bumps includes the steps of applying a thick layer of solder resist to a substrate. The resist is selectively removed to provide wells at solder pads on the substrate. The solder paste is applied to the substrate in the wells. The solder paste is reflowed to form solder bumps on the pads. A socket for a solder bumped member is obtained by first providing a substrate having metalized pads corresponding to the solder bumps of the member. A thick layer of photo definable solder resist is applied to the substrate. The resist is selectively removed to provide wells at the metalized pads of the substrate. Solder paste is then deposited in the wells. The solder bumped member can then be positioned so that the solder bumps are located in the wells. The solder paste is reflowed to bond to the solder bumps and the metalized pads. The solder paste can be selected to have a lower melting temperature than the solder bumps. By reflowing the solder paste at a temperature lower than the melting temperature of the solder bumps, the paste can wet to and blend with the solder bumps while not causing the solder bumps to reflow.

6 Claims, 3 Drawing Sheets

METHOD OF MAKING HIGH DENSITY SOLDER BUMPS AND A SUBSTRATE SOCKET FOR HIGH DENSITY SOLDER BUMPS

This is a continuation of application Ser. No. 07/292,988, filed Jan. 3, 1989 and now abandoned.

BACKGROUND OF THE INVENTION

This invention relates to solder bumps in general and particularly to a method for making high density solder bumps and for providing a socket on a substrate for receiving a solder bumped member. The use of solder bumps on a substrate for attachment to a second substrate by a reflow process is well known in the art. Solder bumps are particularly useful with pad grid array substrates. The closeness or density of solder pads is limited using known technologies due to problems in providing high density solder bumps and preventing the solder bumps from flowing together and shorting pads and bumps when reflowed. One approach for providing solder bumps involves using a stencil process where a stencil is placed over the substrate and solder paste is applied to the substrate through the stencil as by using a squeegee. With this approach the density is limited due to the slumping of the solder paste when the stencil is removed.

Another approach involves the use of solder balls which are precisely placed on a substrate. The placing of solder balls is time consuming and can present reliability problems. If a single ball is misplaced, the proper soldering to the substrate will not be accomplished.

SUMMARY OF THE INVENTION

This method of providing high density solder bumps permits close spacing of the solder with a reliable technique for solder application. The method of attaching a solder bumped member to a substrate provides a socket for self-alignment of the solder bumped member.

This method of forming solder bumps includes the steps of applying a thick layer of solder resist to a substrate. The solder resist is selectively removed to provide wells at solder pads on the substrate. The solder is then applied to form solder bumps on the pads. After forming the solder bumps, the remaining resist can be removed.

In one aspect of the invention a solder paste is applied to the substrate in the wells, and the solder paste is reflowed to form solder bumps. In yet another aspect of the invention the solder paste is applied directly to the substrate with a squeegee. In still another aspect of the invention, the wells are formed to be larger than the solder pads. In an aspect of the invention, the layer solder resist is at least 10 mils. thick.

The method of attaching a solder bumped member to a substrate includes the step of providing a substrate having metalized pads corresponding to the solder bumps of the member. A thick layer of solder resist is applied to the substrate. The solder resist is selectively removed to provide wells at the metalized pads on the substrate. Solder paste is deposited in the wells. The solder bumped member is positioned so that the solder bumps are located in the wells. The solder paste is reflowed to wet and bond to the solder bumps and the metalized pads. In one aspect of the invention, the solder paste is selected to have a melting temperature less than that of the solder bumps. During the heating step, the solder paste is heated to a temperature less than the melting temperature of the solder bumps, but sufficiently high to melt the solder paste and effect a metallurgical connection to both the higher melting temperature solder bumps and the metalized pads of the substrate.

DESCRIPTION OF THE PREFERRED EMBODIMENT

Figure 1:
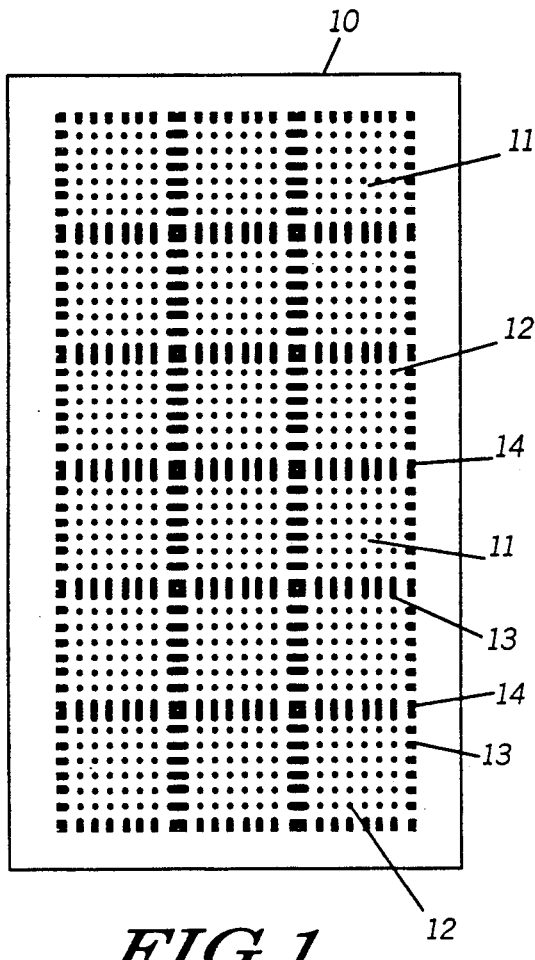
FIG. 1 is a top plan view of an array of substrates with metalized pads.

Referring first to FIG. 1, a substrate 10 is illustrated which includes fifteen pad grid arrays 11 on a single substrate. Each of the pad grid arrays 11 includes a plurality of metalized pads 12 arranged in a matrix. About the periphery of each pad grid array 11 is a plurality of side pads 13 and corner pads 14. The substrate 10 can be any desired material as for example ceramic. The individual pad grid arrays when separated can be used for electronic components such as for integrated circuit chip carriers.

Figure 2:
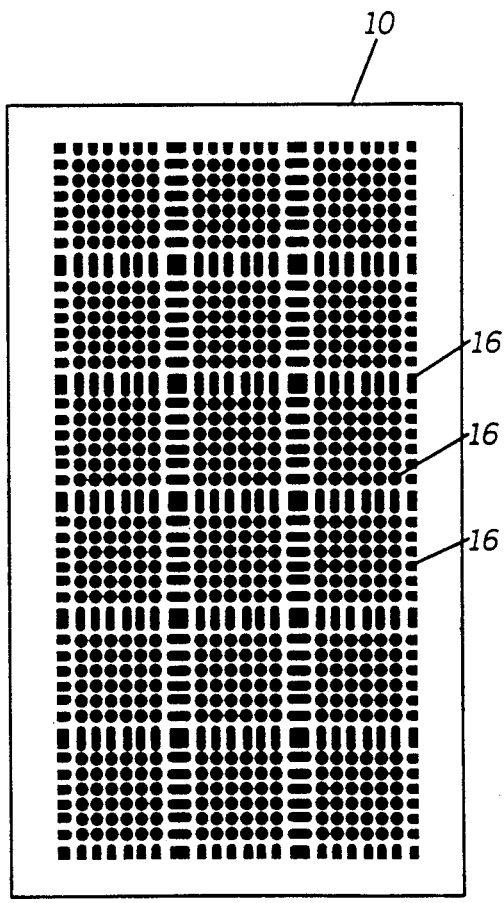
FIG. 2 is a top plan view of the array of substrates after application of solder paste.

FIG. 2, illustrates the substrate 10 after the application of photo definable solder resist which has been exposed and processed to provide areas about the metalized pads 12, 13, and 14 which are slightly larger than the area of the metalized pads. These areas have been filled with solder paste 16 as is discussed below.

Figure 3:
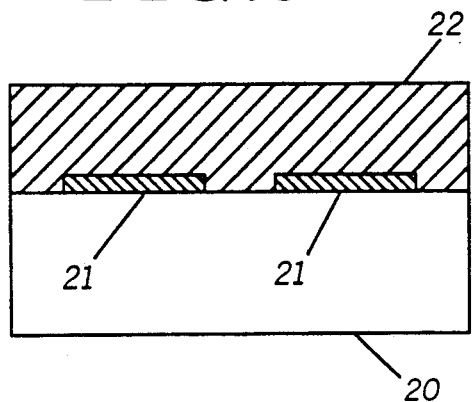
FIG. 3 is a cross-sectional view of a substrate covered with undefined solder resist.

FIG. 3 illustrates a substrate 20 which for clarity shows only two metalized pads 21 which can include a thin layer of solder. The substrate 20 can include any desired pattern of metalized pads 21, which can include a thin layer of solder. A thick layer of photo definable solder resist 22 is applied to the substrate 20. The resist 22 is preferably at least 10 mils. thick and preferably 15 mils. thick. Suitable photo definable solder resist is manufactured by Armstrong World Industries of Lancaster, Pa. and sold under the trademarks FANTON 106, 306, 370, or 363. The resist 22 is then exposed with ultraviolet radiation through a master stencil which defines the areas over the metalized pads 21 and can define an area larger than the metalized pads 21, by sensitizing the resist to then allow selective removal of the resist.

Figure 4:
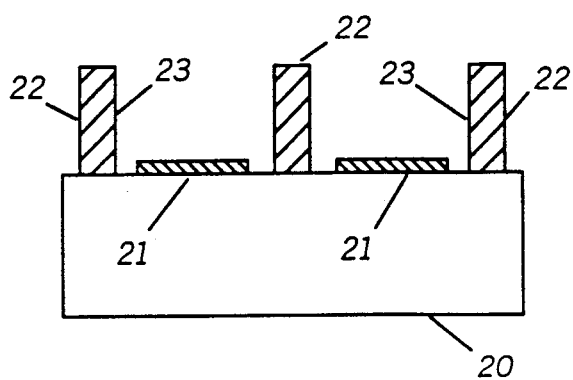
FIG. 4 is a cross sectional view of the substrate of FIG. 3 after selective delineation and removal of resist.
Figure 5:
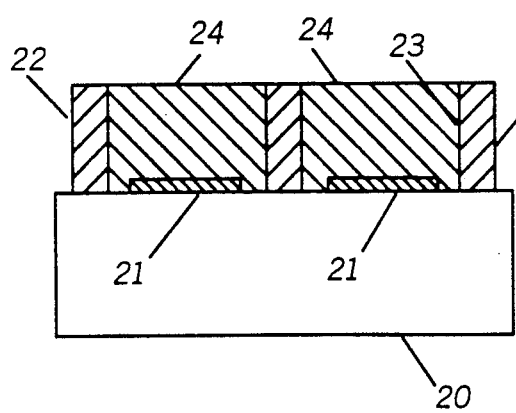
FIG. 5 is a cross-sectional view of the substrate of FIG. 3 after application of solder paste.
Figure 6:
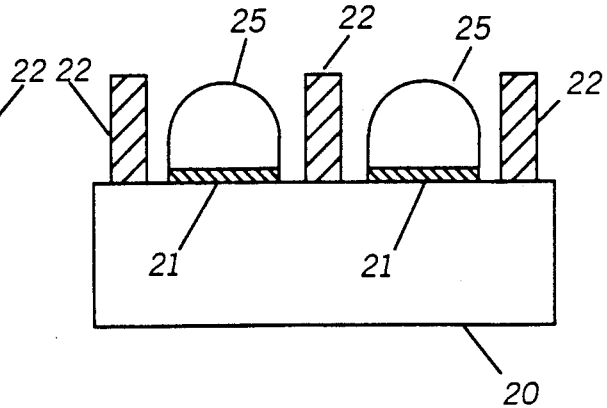
FIG. 6 is a cross-sectional view of the substrate of FIG. 3 after reflow of the paste.
Figure 7:
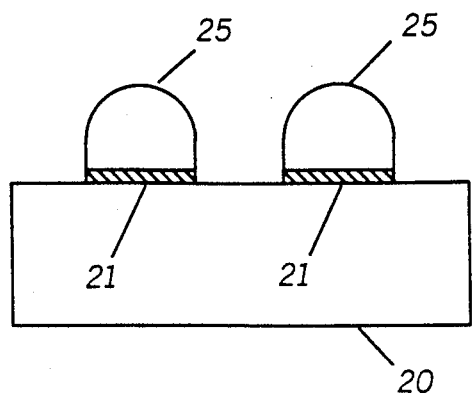
FIG. 7 is a cross-sectional view of the substrate of FIG. 3 after removal of the remaining resist.

The selective removal of the resist 22 provides wells 23 as illustrated in FIG. 4. Solder paste 24 is then applied directly to the substrate 20 as by a squeegee. The remaining resist 22 acts essentially as a stencil capturing the solder paste 24 in the wells 23, as illustrated in FIG. 5. The size of the wells 23 is selected so that an appropriate amount of solder paste 24 is captured in each well. The solder paste 24 is then heated to reflow the solder and form the solder bumps 25 illustrated in FIG. 6. The height of the solder bumps 25 is determined by the composition of the solder paste 24, the area of the metalized pad 21, and by the dimensions of the well 23. Where higher solder bumps 25 are desired, larger wells 23 can be provided so that more solder paste 24 is available for reflow. The solder paste 24, when reflowed, wets and wicks to the metalized pads 21. After the reflow operation, the remaining solder resist 22 can be stripped or removed from the substrate 20 to provide the final solder bumped substrate as illustrated in FIG. 7.

Figure 8:
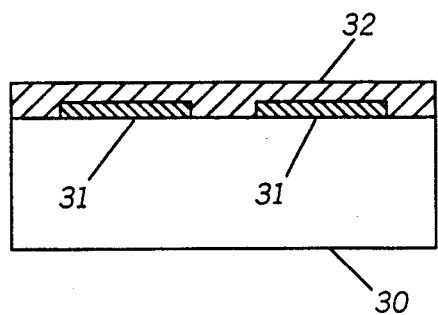
FIG. 8 is a cross-sectional view of a substrate that can be used as a socket for a solder bumped member, shown covered with undefined solder resist.

A similar approach can be utilized for providing a mating substrate for attachment of a solder bumped substrate. A self-fixturing substrate is provided by substrate 30 of FIG. 8. The substrate 30 can be ceramic, polyimide, a printed circuit board or other substrate. The substrate 30 includes metalized pads 31 having a pattern corresponding to that of the solder bumped substrate to which it is being connected, such as that of FIG. 7.

Figure 9:
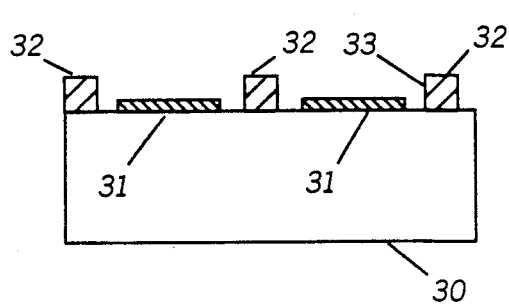
FIG. 9 is a cross-sectional view of the substrate of FIG. 8 after selective delineation and removal of resist.
Figure 10:
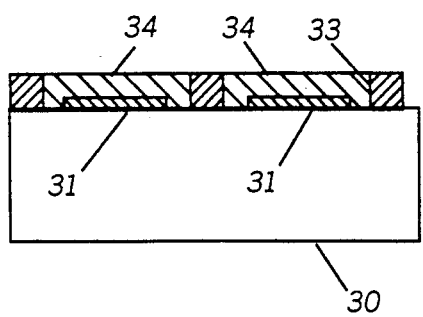
FIG. 10 is a cross-sectional view of the substrate of FIG. 8 after application of solder paste.
Figure 11:
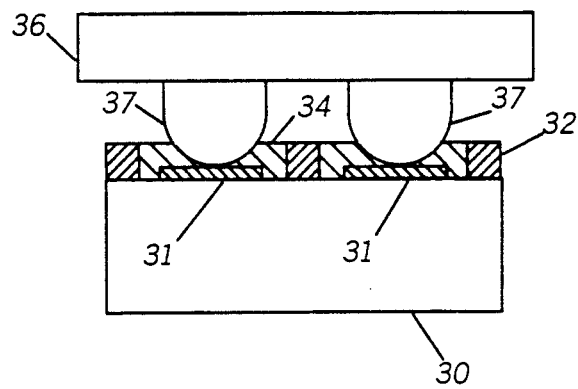
FIG. 11 is a cross-sectional view of the substrate of FIG. 8 showing the positioned bumped member.
Figure 12:
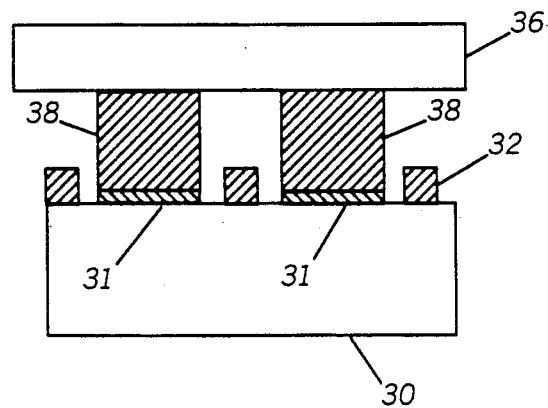
FIG. 12 is a cross-sectional view of the substrate of FIG. 8 after reflow of the solder paste.

A photo definable solder resist 32 (which can be the same as resist 22) is applied over the substrate 30 and is delineated to define wells 33 in the photoresist 32, as illustrated in FIG. 9. Solder paste 34 is then directly applied, as by a squeegee, to fill the wells 33 as illustrated in FIG. 10. A solder bumped member 36 having solder bumps 37, which can be the solder bumped substrate 20 of FIG. 7, is positioned over the substrate 30 so that its solder bumps 37 settle into the solder paste 34. The wells 33 are preferably about 10 mils. (0.01 inches) high and provide the self-aligning or fixturing of the solder bumped member 36, The solder bumps 37 tend to settle into the solder paste 34 under the force of gravity. The assembly is then heated to reflow the solder paste 34 for bonding with the solder bumps 37 and interconnecting the member 36 to substrate 30. A resulting solder interconnection is illustrated as solder 38 of FIG. 12.

Preferably, the solder paste 34 is selected to have a lower melting temperature than the solder of the solder bumps 37. By heating the solder paste 34 to a temperature sufficient to reflow it but less than the melting temperature of the solder bumps 37, the solder paste 34 will flow and wet to the metalized pads 31 and the solder bumps 37, blending with the solder bumps 37. While the solder bumps 37 can be reflowed, it is desirable not to reflow them in order avoid the possibility of the inadvertent shorting of adjacent solder bumps.

We claim as our invention:

1. A method of forming solder bumps comprising the steps of:
    applying a thick layer of resist on the substrate
    forming wells in the resist by selectively removing portions thereof over solder pads on the substrate
    applying solder paste only in the wells to contact the solder pads, and
    reflowing the solder paste to form solder bumps on the solder pads.

2. A method of forming solder bumps as defined in claim 1, including the further step of removing the remaining resist after forming the solder bumps.

3. A method of forming solder bumps as defined in claim 1, in which the layer of resist is approximately 15 mils. thick.

4. A method of forming solder bumps as defined in claim, 1 in which the solder paste is applied to the substrate with a squeegee.

5. A method of forming solder bumps as defined in claim 1, in which the wells are formed to be slightly larger than the solder pads.

6. A method of forming solder bumps as defined in claim 1, in which the layer of solder resist is at least 10 mils. thick.

* * * * *